United States Patent
Iwazaki et al.

(10) Patent No.: US 10,644,623 B2
(45) Date of Patent: May 5, 2020

(54) MOTOR DRIVE APPARATUS AND MOTOR DRIVE APPARATUS CONTROL METHOD

(71) Applicant: Mitsuba Corporation, Gunma (JP)

(72) Inventors: Tamotsu Iwazaki, Kiryu (JP); Toru Furusawa, Kiryu (JP); Takashi Hoshino, Kiryu (JP); Tomofumi Kobayashi, Kiryu (JP)

(73) Assignee: Mitsuba Corporation, Gunma (JP)

( * ) Notice: Subject to any disclaimer, the term of this patent is extended or adjusted under 35 U.S.C. 154(b) by 3 days.

(21) Appl. No.: 15/776,840

(22) PCT Filed: Dec. 1, 2016

(86) PCT No.: PCT/JP2016/085730
§ 371 (c)(1),
(2) Date: May 17, 2018

(87) PCT Pub. No.: WO2017/094839
PCT Pub. Date: Jun. 8, 2017

(65) Prior Publication Data
US 2018/0358912 A1  Dec. 13, 2018

(30) Foreign Application Priority Data
Dec. 2, 2015 (JP) ................. 2015-235583

(51) Int. Cl.
*H02P 6/16* (2016.01)
*H02P 6/182* (2016.01)
(Continued)

(52) U.S. Cl.
CPC ............... *H02P 6/16* (2013.01); *H02K 29/08* (2013.01); *H02M 7/53871* (2013.01);
(Continued)

(58) Field of Classification Search
CPC .................... H02P 6/16; H02P 6/182
See application file for complete search history.

(56) References Cited

U.S. PATENT DOCUMENTS

2011/0089874 A1   4/2011  Shimizu
2012/0161680 A1*  6/2012  Kitagawa ............... H02P 6/182
                                                    318/400.04
(Continued)

FOREIGN PATENT DOCUMENTS

JP   2005304255 A      10/2005
JP   2008236831 A  *  10/2008
(Continued)

OTHER PUBLICATIONS

PCT Office, International Search Report issued in PCT/JP2016/085730 dated Feb. 21, 2017, 2 pages.
(Continued)

*Primary Examiner* — Cortez M Cook
(74) *Attorney, Agent, or Firm* — Wood Herron & Evans LLP

(57) ABSTRACT

Based on an output signal, among a plurality of switching elements, an element control part outputs a PWM signal having a maximum duty ratio to a pair of switching elements that drive a first coil among a plurality of coils to a high level, outputs a PWM signal having a minimum duty ratio to a pair of switching elements that are connected to each other in series and that drive a second coil among the plurality of coils to a low level, and outputs a PWM signal having a medium duty ratio between the maximum duty ratio of the PWM signal and the minimum duty ratio of the PWM signal to a pair of switching elements that are connected to each other in series and that drive a third coil among the plurality of coils.

3 Claims, 5 Drawing Sheets

(51) Int. Cl.
| | |
|---|---|
| *H02P 6/26* | (2016.01) |
| *H02K 29/08* | (2006.01) |
| *H02M 7/5387* | (2007.01) |
| *H02P 27/08* | (2006.01) |
| *H03K 7/08* | (2006.01) |
| *H03K 17/16* | (2006.01) |
| *H03K 17/687* | (2006.01) |

(52) U.S. Cl.
CPC .............. *H02P 6/26* (2016.02); *H02P 27/085* (2013.01); *H03K 7/08* (2013.01); *H03K 17/163* (2013.01); *H03K 17/6872* (2013.01)

(56) References Cited

U.S. PATENT DOCUMENTS

2014/0117895 A1\* 5/2014 Lee ........................... H02P 6/17
318/400.11
2015/0061555 A1 3/2015 Hamasaki et al.

FOREIGN PATENT DOCUMENTS

| JP | 2008236831 A | 10/2008 |
|---|---|---|
| JP | 2014023257 A | 2/2014 |
| WO | 2014054096 A1 | 4/2014 |

OTHER PUBLICATIONS

European Patent Office, Search Report issued in EP 16870776.8 dated Jun. 17, 2019, 11 pages.
Japanese Patent Office, Office Action issued in JP 2015-235583 dated Jun. 25, 2019, 6 pages.

\* cited by examiner

MOTOR DRIVE APPARATUS AND MOTOR DRIVE APPARATUS CONTROL METHOD

TECHNICAL FIELD

The present invention relates to a motor drive apparatus and a motor drive apparatus control method.

Priority is claimed on Japanese Patent Application No. 2015-235583 filed on Dec. 2, 2015, the contents of which are incorporated herein by reference.

BACKGROUND

In the related art, in a case where a brushless motor is driven by a 120° rectangular wave, there is a possibility that a control circuit which drives a switching element that is used for a positive electrode and that drives the brushless motor may malfunction when a negative voltage is generated at an input terminal of the brushless motor. This possibility is described with reference to FIG. 4 to FIG. 6.

FIG. 4 is a block diagram showing a control system of a motor drive apparatus. FIG. 5 is a view showing a commutation pattern in a 120° rectangular wave drive. FIG. 6 is a view showing a situation that occurs when a negative voltage is generated at an input terminal of a motor.

A motor 18 shown in FIG. 4 is a three-phase DC brushless motor. The motor 18 is an inner rotor type and includes a rotor including a buried permanent magnet including a pair of a N-pole and a S-pole. The motor 18 includes an armature coil (U-phase coil, V-phase coil, W-phase coil). One end of the U-phase coil is connected to a terminal 24, and the other end is connected to a terminal 25. One end of the V-phase coil is connected to the terminal 25, and the other end is connected to a terminal 26. One end of the W-phase coil is connected to the terminal 26, and the other end is connected to the terminal 24. In this way, the armature coil is connected by a delta connection in the motor 18.

A motor drive apparatus 37a that controls the motor 18 includes an inverter circuit 38 that controls power distribution with respect to the armature coil. The inverter circuit 38 is connected to the terminal 24, the terminal 25, and the terminal 26. The inverter circuit 38 includes a series circuit 38U in which a switching element 38a on the positive electrode side that is connected to a positive electrode of an external electric source 40 is connected in series to a switching element 38d on the negative electrode side that is connected to a negative electrode of the external electric source 40. The inverter circuit 38 includes a series circuit 38V in which a switching element 38b on the positive electrode side that is connected to a positive electrode of an external electric source 40 is connected in series to a switching element 38e on the negative electrode side that is connected to a negative electrode of the external electric source 40. The inverter circuit 38 includes a series circuit 38W in which a switching element 38c on the positive electrode side that is connected to a positive electrode of an external electric source 40 is connected in series to a switching element 38f on the negative electrode side that is connected to a negative electrode of the external electric source 40. In the inverter circuit 38, the series circuit 38U corresponds to the U-phase and is connected to the terminal 24. In the inverter circuit 38, the series circuit 38V corresponds to the V-phase and is connected to the terminal 25, and the series circuit 38W corresponds to the W-phase and is connected to the terminal 26.

That is, the inverter circuit 38 includes a plurality of switching elements 38a to 38f that separately connects or cuts off current supply routes from the external electric source 40 to the terminals (the terminal 24, the terminal 25, and the terminal 26) of the armature coil. The plurality of switching elements 38a to 38f are formed of a semiconductor element such as an FET.

Further, the motor drive apparatus 37a includes a control circuit 45a that controls the inverter circuit 38. The control circuit 45a is a microcomputer that includes a CPU, a RAM, a ROM, and the like. The control circuit 45a includes a control part 50a, a FET drive electric source 51, and a driver circuit 52.

The driver circuit 52 outputs a drive signal that controls gate terminals of the switching elements 38a to 38f separately.

The FET drive electric source 51 is an electric source for supplying electric power from the external electric source 40 to a buffer that controls the switching elements 38a, 38b, 38c among buffers included in the driver circuit 52.

The control part 50a reads out a power distribution pattern that corresponds to a Hall stage number stored in a ROM which the control circuit 45a has on the basis of the combination (Hall stage number) of output signals of detection sensors 41 to 43 and outputs a PWM command signal to the driver circuit 52 in accordance with the power distribution pattern. The driver circuit 52 outputs a drive signal that controls gate terminals of the switching elements 38a to 38f separately on the basis of the PWM command signal that is input from the control part 50a.

The detection sensors 41 to 43 which the motor drive apparatus 37a has are formed of, for example, a Hall IC and output, when a rotor is rotated, rotation positions (rotation phases) of the rotor as output signals that correspond to the U-phase, the V-phase, and the W-phase individually to the control part 50a. The control part 50a recognizes the Hall stage number on the basis of the output signal that is input from the detection sensors 41 to 43, reads out a power distribution pattern that corresponds to the Hall stage number, performs shifting by an amount (for example, electric angle of 30°) that corresponds to a predetermined rotation phase, and then outputs a PWM command signal to the driver circuit 52 in accordance with the power distribution pattern that is read out.

Thereby, each of the switching elements 38a to 38f is driven by the PWM control and is turned on or turned off intermittently in a period of time that corresponds to each power distribution pattern.

For example, as shown in FIG. 5, when the Hall stage number HS2 in which output signals of the detection sensors 41 to 43 are (ON (high level), OFF (low level), OFF) is switched to the Hall stage number HS3 in which the output signals of the detection sensors 41 to 43 are (ON, ON, OFF), after an electric angle of 30° from the switching, the power distribution pattern is switched from TP2a to TP3a.

In a period of time that corresponds to the power distribution pattern TP2a, since the switching elements 38a, 38d are (ON, OFF), power is distributed to the terminal 24 to the U-phase coil, the terminal 24 is in a high level, and the U-phase coil is in a phase power distribution period. Since the switching elements 38b, 38e are (OFF, OFF), power is not distributed to the terminal 25 to the V-phase coil, and the V-phase coil is in a phase open period (floating level period). Since the switching elements 38c, 38f are switched alternately between ON and OFF, power is distributed to the terminal 26 to the W-phase coil, the terminal 26 is in a low level, and the W-phase coil is in a phase power distribution period.

In a period of time that corresponds to the power distribution pattern TP3a, since the switching elements 38a, 38d are (OFF, OFF), power is not distributed to the terminal 24 to the U-phase coil, and the U-phase coil is in a phase open period. Since the switching elements 38b, 38e are (ON, OFF), power is distributed to the terminal 25 to the V-phase coil, the terminal 25 is in a high level, and the V-phase coil is in a phase power distribution period. Since the switching elements 38c, 38f are switched alternately between ON and OFF, power is distributed to the terminal 26 to the W-phase coil, the terminal 26 is in a low level, and the W-phase coil is in a phase power distribution period.

An example is described about a possibility that the control circuit 45a which drives the switching element 38a (switching element that is used for a positive electrode and that drives the brushless motor) may malfunction when the power distribution pattern TP2a is switched to the power distribution pattern TP3a and when a negative voltage is generated at the terminal 24 (an input terminal of the brushless motor).

In FIG. 6, a terminal voltage of a motor line represents the voltage of the terminal 24. A flow-out current represents a current that flows from the FET drive electric source 51 to the terminal 24 via a buffer circuit that constitutes the driver circuit 52. A FET drive voltage represents an output voltage of the FET drive electric source 51.

After switching to the power distribution pattern TP3a, for a period of several hundred μsec or more, a reverse electromotive voltage (negative voltage) is generated. The several hundred μsec of the generation time is a period of about 100 to 800 μsec and represents a period of the power distribution pattern TP3a.

A voltage difference (a negative voltage that is generated when the switching element is switched from ON to OFF when the power distribution pattern is changed from the power distribution pattern TP2a to the power distribution pattern TP3a) of a change from the terminal voltage of the motor line at the time of the power distribution pattern TP2a to the terminal voltage of the motor line at the time of the power distribution pattern TP3a becomes, for example, −0.5V or less, and thereby, an unexpected current flows out from the FET drive electric source 51. As a result, the supplied power exceeds an electric source supply capacity of the FET drive electric source 51, and the FET drive voltage is decreased (dropped). In a state where the FET drive voltage becomes insufficient, when the buffer of the driver circuit 52 drives the switching element 38a, a normal electric source voltage is not applied to the control circuit 45a that drives the switching element 38a, and therefore, there is a possibility that the switching element 38a may malfunction when being driven.

Such a period in which the FET drive voltage causes a voltage decrease is, as indicated by a region in FIG. 5 surrounded by a circle mark, a period in which a state where the switching elements 38c, 38f are (ON, OFF) of a period corresponding to the power distribution pattern TP6a is switched to a state where the switching elements 38c, 38f are (OFF, OFF) of a period corresponding to the power distribution pattern TP1a, and the W-phase coil becomes in a phase open period. Further, as described above, the period in which the FET drive voltage causes a voltage decrease is a period in which a state where the switching elements 38a, 38d are (ON, OFF) of a period corresponding to the power distribution pattern TP2a is switched to a state where the switching elements 38a, 38d are (OFF, OFF) of a period corresponding to the power distribution pattern TP3a, and the U-phase coil becomes in a phase open period. Further, the period in which the FET drive voltage causes a voltage decrease is a period in which a state where the switching elements 38b, 38e are (ON, OFF) of a period corresponding to the power distribution pattern TP4a is switched to a state where the switching elements 38b, 38e are (OFF, OFF) of a period corresponding to the power distribution pattern TP5a, and the V-phase coil becomes in a phase open period.

In order to shorten such a period in which the FET drive voltage causes a voltage decrease, a motor drive apparatus that includes a function of reducing a period in which a negative voltage is generated at the input terminal of the brushless motor is required.

A motor drive apparatus that includes a regeneration means for allowing a current which is generated by a reverse electromotive force of a coil to flow to an electric source is described, for example, in Patent Document 1. However, the motor drive apparatus described in Patent Document 1 does not include a function of reducing a period in which a negative voltage is generated at an input terminal.

RELATED ART DOCUMENTS

Patent Documents

[Patent Document 1] Japanese Unexamined Patent Application, First Publication No. 2005-304255

SUMMARY OF INVENTION

Problems to be Solved by the Invention

As described above, a motor drive apparatus that includes a function of reducing a period in which a negative voltage is generated at an input terminal of a brushless motor is required.

The present invention provides a motor drive apparatus and a motor drive apparatus control method that include a function of reducing a period in which a negative voltage is generated at an input terminal of a brushless motor.

Means for Solving the Problem

An aspect of the present invention is a motor drive apparatus that supplies a current to a plurality of coils and that rotates a rotor, the motor drive apparatus including: a plurality of switching elements that turn on or turn off respective current supply routes connected to the plurality of coils; a plurality of detection sensors each of which is provided at a phase different from one another in a rotation direction of the rotor and which are configured to detect a phase in a rotation direction of the rotor and generate an output signal; and an element control part that turns on or turns off the plurality of switching elements individually based on the output signal, wherein, based on the output signal, among the plurality of switching elements, the element control part outputs a PWM signal having a maximum duty ratio to a pair of switching elements that drive a first coil among the plurality of coils to a high level, outputs a PWM signal having a minimum duty ratio to a pair of switching elements that are connected to each other in series and that drive a second coil among the plurality of coils to a low level, and outputs a PWM signal having a medium duty ratio between the maximum duty ratio of the PWM signal and the minimum duty ratio of the PWM signal to a pair of switching elements that are connected to each other in series and that drive a third coil among the plurality of coils.

Further, an aspect of the present invention is the motor drive apparatus described above, wherein the medium duty ratio is 50%, the maximum duty ratio is a duty ratio obtained by adding half of a command duty ratio that is externally input to the medium duty ratio, and the minimum duty ratio is a duty ratio obtained by subtracting half of the command duty ratio from the medium duty ratio.

Further, an aspect of the present invention is the motor drive apparatus described above, wherein the medium duty ratio is 50% of a command duty ratio that is externally input, the maximum duty ratio is the command duty ratio, and the minimum duty ratio is 0%.

An aspect of the present invention is a motor drive apparatus control method which is a control method of a motor drive apparatus that supplies a current to a plurality of coils and that rotates a rotor, the motor drive apparatus including: a plurality of switching elements that turn on or turn off respective current supply routes connected to the plurality of coils; a plurality of detection sensors each of which is provided at a phase different from one another in a rotation direction of the rotor and which are configured to detect a phase in a rotation direction of the rotor and generate an output signal; and an element control part that turns on or turns off the plurality of switching elements individually based on the output signal, wherein, based on the output signal, among the plurality of switching elements, the element control part: outputs a PWM signal having a maximum duty ratio to a pair of switching elements that drive a first coil among the plurality of coils to a high level, outputs a PWM signal having a minimum duty ratio to a pair of switching elements that are connected to each other in series and that drive a second coil among the plurality of coils to a low level, and outputs a PWM signal having a medium duty ratio between the maximum duty ratio of the PWM signal and the minimum duty ratio of the PWM signal to a pair of switching elements that are connected to each other in series and that drive a third coil among the plurality of coils.

Advantage of the Invention

As described above, an aspect of the present invention provides a motor drive apparatus and a motor drive apparatus control method that include a function of reducing a period in which a negative voltage is generated at an input terminal of a brushless motor since the element control part in the motor drive apparatus shorten a period in which each coil becomes a phase open period.

DESCRIPTION OF THE EMBODIMENTS

Figure 1:
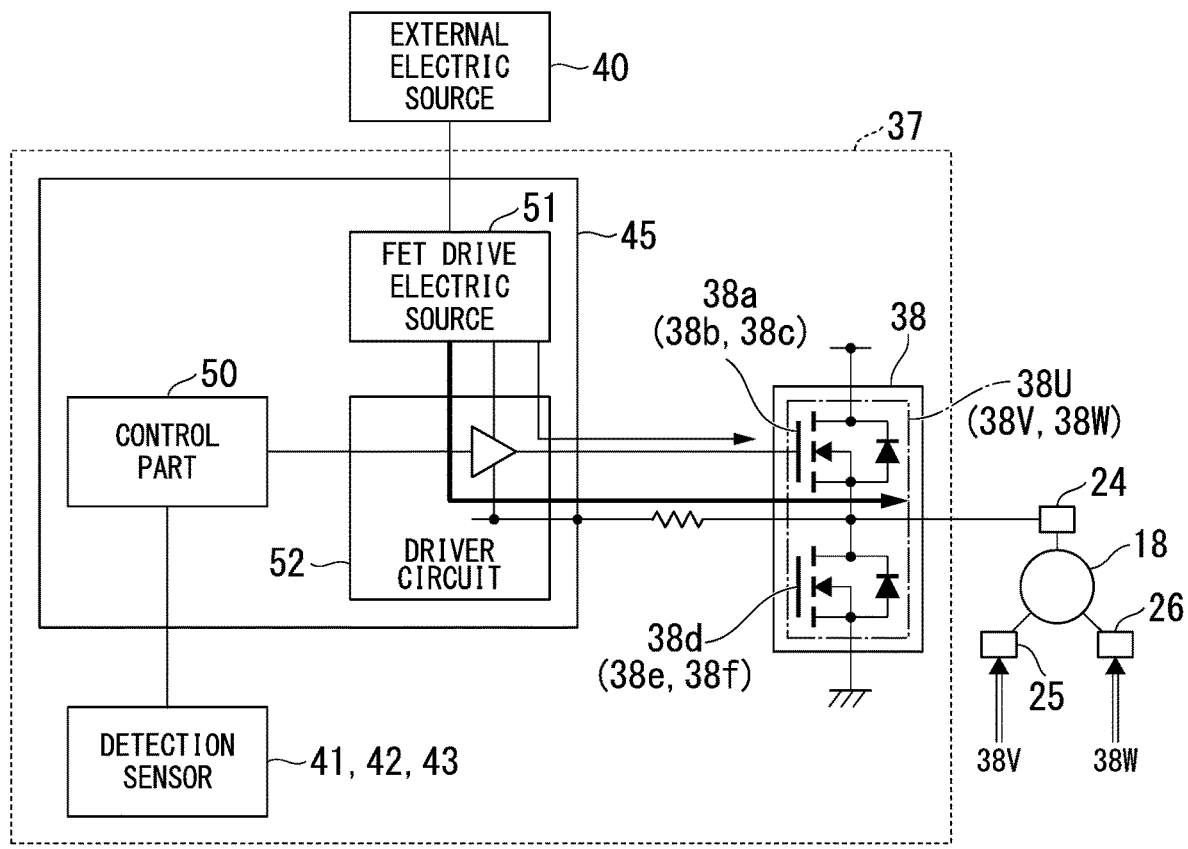
FIG. 1 is a block diagram showing a control system of a motor drive apparatus of the present invention.

Hereinafter, aspects of the present invention are described according to an embodiment of the invention, but the following embodiment does not limit the invention according to claims. Further, all of the combinations of features described in the embodiment are not necessarily indispensable for solving the problem addressed by the invention. In the drawings, the same reference numerals may be given to the same or similar parts, and redundant descriptions may be omitted. The shape, size, and the like of an element in the drawing may be exaggerated for clear description.

A motor drive apparatus in an embodiment is a motor drive apparatus that supplies a current to a plurality of coils and that rotates a rotor, the motor drive apparatus including: a plurality of switching elements that turn on or turn off respective current supply routes connected to the plurality of coils; a plurality of detection sensors each of which is provided at a phase different from one another in a rotation direction of the rotor and which are configured to detect a phase in a rotation direction of the rotor and generate an output signal; and an element control part that turns on or turns off the plurality of switching elements individually based on the output signal, wherein, based on the output signal, the element control part outputs a PWM signal having a maximum duty ratio to, among the plurality of switching elements, a pair of switching elements that drive a first coil among the plurality of coils to a high level, outputs a PWM signal having a minimum duty ratio to a pair of switching elements that are connected to each other in series and that drive a second coil among the plurality of coils to a low level, and outputs a PWM signal having a medium duty ratio between the maximum duty ratio of the PWM signal and the minimum duty ratio of the PWM signal to a pair of switching elements that are connected to each other in series and that drive a third coil among the plurality of coils.

Hereinafter, the motor drive apparatus in the embodiment is described with reference to the drawings.

Figure 4:
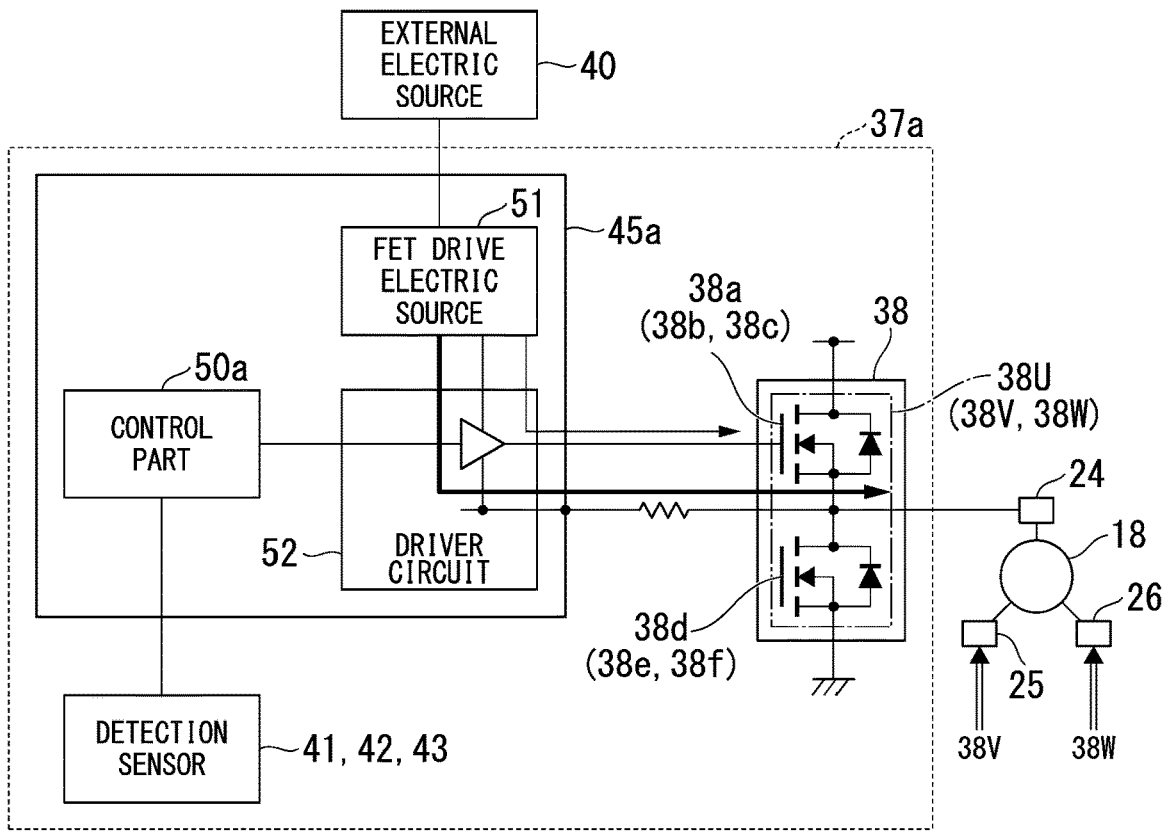
FIG. 4 is a block diagram showing a control system of a motor drive apparatus.

FIG. 1 is a block diagram showing a control system of a motor drive apparatus of the present invention. In FIG. 1, the same reference numerals are given to the same parts as those of FIG. 4, and the description of the parts is omitted. As shown in FIG. 1, a motor drive apparatus 37 includes a control circuit 45, detection sensors 41 to 43, and an inverter circuit 38 that includes a series circuit 38U in which a switching element 38a on a positive electrode side is connected in series to a switching element 38d on a negative electrode side that is connected to a negative electrode of an external electric source 40 and the like. The control circuit 45 includes a control part 50 (element control part), a FET drive electric source 51, and a driver circuit 52.

The control part 50 reads out a power distribution pattern that corresponds to a Hall stage number stored in a ROM which the control circuit 45 has on the basis of the combination (Hall stage number) of output signals of the detection sensors 41 to 43 and outputs a PWM command signal to the driver circuit 52 in accordance with the power distribution pattern. The driver circuit 52 outputs a drive signal that controls gate terminals of switching elements 38a to 38f separately on the basis of the PWM command signal that is input from the control part 50.

The detection sensors 41 to 43 which the motor drive apparatus 37 has are formed of, for example, a Hall IC and output, when a rotor is rotated, rotation positions (rotation phases) of the rotor as output signals that correspond to the U-phase, the V-phase, and the W-phase individually to the control part 50. The control part 50 recognizes the Hall stage number on the basis of the output signal that is input from the detection sensors 41 to 43, reads out a power distribution pattern that corresponds to the Hall stage number, performs shifting by an amount (for example, electric angle of 30°) that corresponds to a predetermined rotation phase, and then outputs a PWM command signal to the driver circuit 52 in accordance with the power distribution pattern that is read out.

Thereby, each of the switching elements 38*a* to 38*f* is driven by the PWM control and is turned on or turned off intermittently in a period of time that corresponds to each power distribution pattern.

Figure 2:
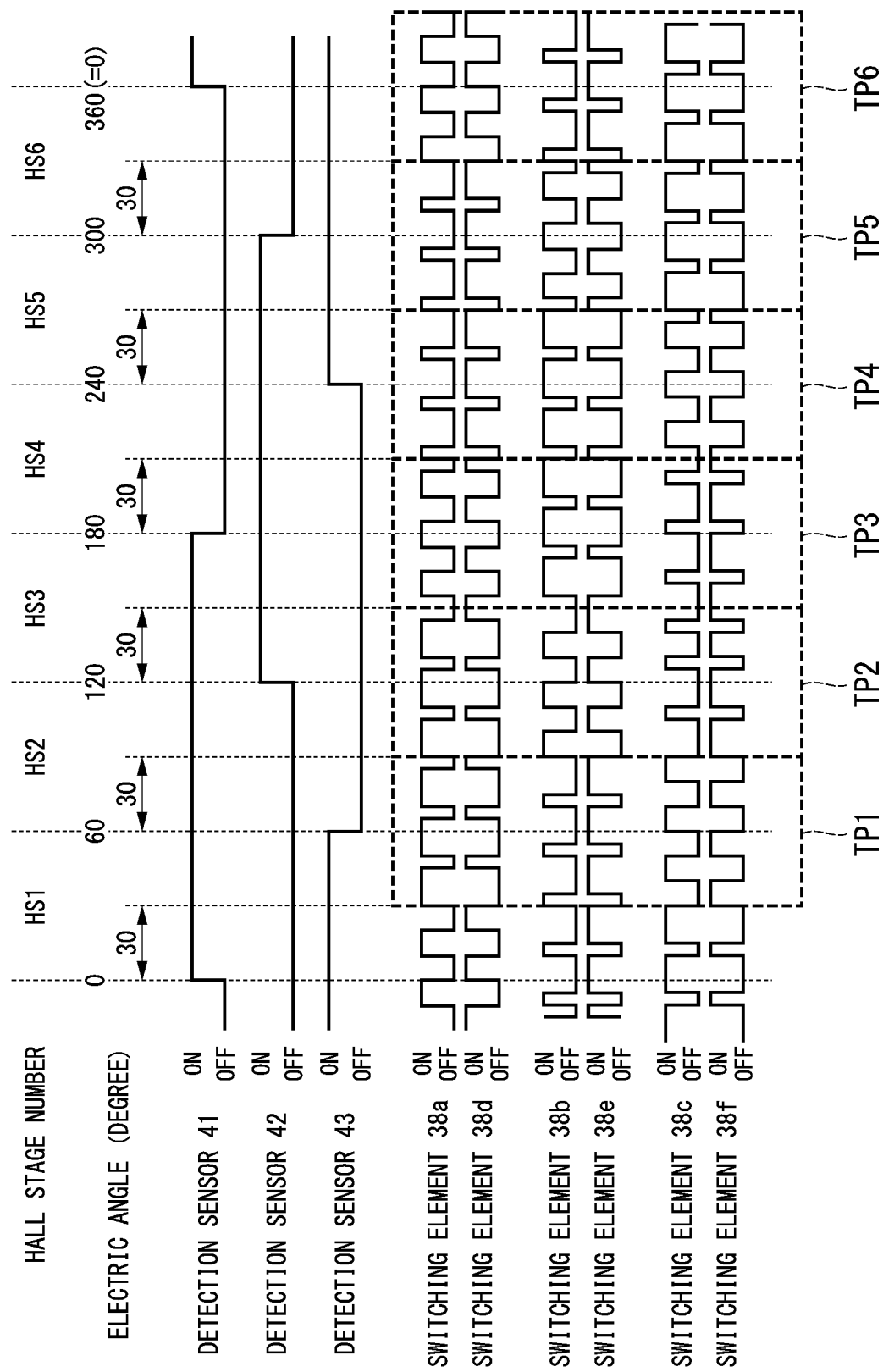
FIG. 2 is view showing a commutation pattern in a 120° rectangular wave drive of the present invention.

FIG. 2 is view showing a commutation pattern in a 120° rectangular wave drive of the present invention.

As shown in FIG. 2, in an electric angle of 0°, when the Hall stage number HS6 in which the output signals of the detection sensors 41 to 43 are (OFF, OFF, ON) is switched to the Hall stage number HS1 in which the output signals of the detection sensors 41 to 43 are (ON, OFF, ON), the electric angle of 0° is switched to an electric angle of 30°, and the power distribution pattern is switched from TP6 to TP1.

In a period of time that corresponds to the power distribution pattern TP1, a switching element 38*a* on a positive electrode side among a pair of the switching element 38*a* and the switching element 38*d* is driven by a PWM signal (drive signal) that repeats between ON and OFF at a high duty ratio (maximum duty ratio). The duty ratio is defined by a ratio of an ON period to the cycle of the PWM signal that is output by the driver circuit 52. A PWM signal of a reverse phase to the PWM signal that is input to the switching element 38*a* on the positive electrode side is input to the switching element 38*d* on a negative electrode side. The duty ratio of the PWM signal that drives the pair of switching elements is different between the positive electrode side and the negative electrode side. However, in the present embodiment, the duty ratio of the PWM signal that drives the switching element on the positive electrode side is referred to as the duty ratio of the PWM signal that drives the pair of switching elements.

That is, in the period of time that corresponds to the power distribution pattern TP1, the pair of the switching element 38*a* and the switching element 38*d* are driven by the PWM signal (drive signal) that repeats ON and OFF at a high duty ratio (maximum duty ratio). Thereby, power is distributed to the terminal 24 to the U-phase coil, the terminal 24 is in a high level, and the U-phase coil is in a phase power distribution period.

In the period of time that corresponds to the power distribution pattern TP1, the pair of the switching element 38*b* and the switching element 38*e* are driven by the PWM signal that repeats ON and OFF at a low duty ratio (minimum duty ratio). Thereby, power is distributed to the terminal 25 to the V-phase coil, the terminal 25 is in a low level, and the V-phase coil is in a phase power distribution period.

In the period of time that corresponds to the power distribution pattern TP1, the pair of the switching element 38*c* and the switching element 38*f* are driven by the PWM signal that repeats ON and OFF at a medium duty ratio. Thereby, power is distributed to the terminal 26 to the W-phase coil, the terminal 26 is in a medium level between the high level of the terminal 24 and the low level of the terminal 25, and the W-phase coil is not in a phase open period of the related art but is in a phase power distribution period.

In the present embodiment, the medium duty ratio is 50%. The high duty ratio is a duty ratio obtained by adding half of a command duty ratio that is externally input to the medium duty ratio. The low duty ratio is a duty ratio obtained by subtracting half of the command duty ratio from the medium duty ratio. A user may store the command duty ratio in advance in a ROM of the control circuit 45.

Next, in an electric angle of 60°, when the Hall stage number HS1 in which the output signals of the detection sensors 41 to 43 are (ON, OFF, ON) is switched to the Hall stage number HS2 in which the output signals of the detection sensors 41 to 43 are (ON, OFF, OFF), the electric angle of 60° is switched to an electric angle of 90°, and the power distribution pattern is switched from TP1 to TP2.

In a period of time that corresponds to the power distribution pattern TP2, the pair of the switching element 38*a* and the switching element 38*d* are driven by the PWM signal that repeats ON and OFF at a high duty ratio. Thereby, power is distributed to the terminal 24 to the U-phase coil, the terminal 24 is in a high level, and the U-phase coil is in a phase power distribution period.

In the period of time that corresponds to the power distribution pattern TP2, the pair of the switching element 38*c* and the switching element 38*f* are driven by the PWM signal that repeats ON and OFF at a low duty ratio. Thereby, power is distributed to the terminal 26 to the W-phase coil, the terminal 26 is in a low level, and the W-phase coil is in a phase power distribution period.

In the period of time that corresponds to the power distribution pattern TP2, the pair of the switching element 38*b* and the switching element 38*e* are driven by the PWM signal that repeats ON and OFF at a medium duty ratio. Thereby, power is distributed to the terminal 25 to the V-phase coil, the terminal 25 is in a medium level between the high level of the terminal 24 and the low level of the terminal 26, and the V-phase coil is not in a phase open period of the related art but is in a phase power distribution period.

Next, in an electric angle of 120°, when the Hall stage number HS2 in which the output signals of the detection sensors 41 to 43 are (ON, OFF, OFF) is switched to the Hall stage number HS3 in which the output signals of the detection sensors 41 to 43 are (ON, ON, OFF), the electric angle of 120° is switched to an electric angle of 150°, and the power distribution pattern is switched from TP2 to TP3.

In a period of time that corresponds to the power distribution pattern TP3, the pair of the switching element 38*b* and the switching element 38*e* are driven by the PWM signal that repeats ON and OFF at a high duty ratio. Thereby, power is distributed to the terminal 25 to the V-phase coil, the terminal 25 is in a high level, and the V-phase coil is in a phase power distribution period.

In the period of time that corresponds to the power distribution pattern TP3, the pair of the switching element 38*c* and the switching element 38*f* are driven by the PWM signal that repeats ON and OFF at a low duty ratio. Thereby, power is distributed to the terminal 26 to the W-phase coil, the terminal 26 is in a low level, and the W-phase coil is in a phase power distribution period.

In the period of time that corresponds to the power distribution pattern TP3, the pair of the switching element 38*a* and the switching element 38*d* are driven by the PWM signal that repeats ON and OFF at a medium duty ratio. Thereby, power is distributed to the terminal 24 to the U-phase coil, the terminal 24 is in a medium level between the high level of the terminal 25 and the low level of the terminal 26, and the U-phase coil is not in a phase open period of the related art but is in a phase power distribution period.

Next, in an electric angle of 180°, when the Hall stage number HS3 in which the output signals of the detection sensors 41 to 43 are (ON, ON, OFF) is switched to the Hall stage number HS4 in which the output signals of the detection sensors 41 to 43 are (OFF, ON, OFF), the electric angle of 180° is switched to an electric angle of 210°, and the power distribution pattern is switched from TP3 to TP4.

In a period of time that corresponds to the power distribution pattern TP4, the pair of the switching element 38*b* and the switching element 38*e* are driven by the PWM signal that repeats ON and OFF at a high duty ratio. Thereby, power is distributed to the terminal 25 to the V-phase coil, the terminal 25 is in a high level, and the V-phase coil is in a phase power distribution period.

In the period of time that corresponds to the power distribution pattern TP4, the pair of the switching element 38*a* and the switching element 38*d* are driven by the PWM signal that repeats ON and OFF at a low duty ratio. Thereby, power is distributed to the terminal 24 to the U-phase coil, the terminal 24 is in a low level, and the U-phase coil is in a phase power distribution period.

In the period of time that corresponds to the power distribution pattern TP4, the pair of the switching element 38*c* and the switching element 38*f* are driven by the PWM signal that repeats ON and OFF at a medium duty ratio. Thereby, power is distributed to the terminal 26 to the W-phase coil, the terminal 26 is in a medium level between the high level of the terminal 25 and the low level of the terminal 24, and the W-phase coil is not in a phase open period of the related art but is in a phase power distribution period.

Next, in an electric angle of 240°, when the Hall stage number HS4 in which the output signals of the detection sensors 41 to 43 are (OFF, ON, OFF) is switched to the Hall stage number HS5 in which the output signals of the detection sensors 41 to 43 are (OFF, ON, ON), the electric angle of 240° is switched to an electric angle of 270°, and the power distribution pattern is switched from TP4 to TP5.

In a period of time that corresponds to the power distribution pattern TP5, the pair of the switching element 38*c* and the switching element 38*f* are driven by the PWM signal that repeats ON and OFF at a high duty ratio. Thereby, power is distributed to the terminal 26 to the W-phase coil, the terminal 26 is in a high level, and the W-phase coil is in a phase power distribution period.

In the period of time that corresponds to the power distribution pattern TP5, the pair of the switching element 38*a* and the switching element 38*d* are driven by the PWM signal that repeats ON and OFF at a low duty ratio. Thereby, power is distributed to the terminal 24 to the U-phase coil, the terminal 24 is in a low level, and the U-phase coil is in a phase power distribution period.

In the period of time that corresponds to the power distribution pattern TP5, the pair of the switching element 38*b* and the switching element 38*e* are driven by the PWM signal that repeats ON and OFF at a medium duty ratio. Thereby, power is distributed to the terminal 25 to the V-phase coil, the terminal 25 is in a medium level between the high level of the terminal 26 and the low level of the terminal 24, and the V-phase coil is not in a phase open period of the related art but is in a phase power distribution period.

Next, in an electric angle of 300°, when the Hall stage number HS5 in which the output signals of the detection sensors 41 to 43 are (OFF, ON, ON) is switched to the Hall stage number HS6 in which the output signals of the detection sensors 41 to 43 are (OFF, OFF, ON), the electric angle of 300° is switched to an electric angle of 330°, and the power distribution pattern is switched from TP5 to TP6.

In a period of time that corresponds to the power distribution pattern TP6, the pair of the switching element 38*c* and the switching element 38*f* are driven by the PWM signal that repeats ON and OFF at a high duty ratio. Thereby, power is distributed to the terminal 26 to the W-phase coil, the terminal 26 is in a high level, and the W-phase coil is in a phase power distribution period.

In the period of time that corresponds to the power distribution pattern TP6, the pair of the switching element 38*b* and the switching element 38*e* are driven by the PWM signal that repeats ON and OFF at a low duty ratio. Thereby, power is distributed to the terminal 25 to the V-phase coil, the terminal 25 is in a low level, and the V-phase coil is in a phase power distribution period.

In the period of time that corresponds to the power distribution pattern TP6, the pair of the switching element 38*a* and the switching element 38*d* are driven by the PWM signal that repeats ON and OFF at a medium duty ratio. Thereby, power is distributed to the terminal 24 to the U-phase coil, the terminal 24 is in a medium level between the high level of the terminal 26 and the low level of the terminal 25, and the U-phase coil is not in a phase open period of the related art but is in a phase power distribution period.

According to the above configuration, the motor drive apparatus 37 supplies a current to the U-phase coil, the V-phase coil, and the W-phase coil that constitute a motor 18 and rotates the rotor of the motor 18 by a 180° rectangular wave drive.

Specifically, the control part 50 in the motor drive apparatus 37 reads out a power distribution pattern that corresponds to a Hall stage number stored in the ROM which the control circuit 45 has on the basis of the combination (Hall stage number) of the output signals of the detection sensors 41 to 43 and outputs a PWM command signal to the driver circuit 52 in accordance with the power distribution pattern. The driver circuit 52 outputs a drive signal that controls the gate terminals of the switching elements 38*a* to 38*f* separately on the basis of the PWM command signal that is input from the control part 50.

The detection sensors 41 to 43 which the motor drive apparatus 37 has are formed of, for example, a Hall IC and output, when the rotor is rotated, rotation positions of the rotor as output signals that correspond to the U-phase, the V-phase, and the W-phase individually to the control part 50. The control part 50 recognizes the Hall stage number on the basis of the output signals input from the detection sensors 41 to 43, reads out a power distribution pattern that corresponds to the Hall stage number, performs shifting by an amount (for example, electric angle of 30°) that corresponds to a predetermined rotation phase, and then outputs a PWM command signal to the driver circuit 52 in accordance with the power distribution pattern that is read out.

As shown in FIG. 2, each of the switching elements 38*a* to 38*f* is driven by the PWM control and is turned on or turned off intermittently in a period of time that corresponds to each power distribution pattern.

Figure 3:
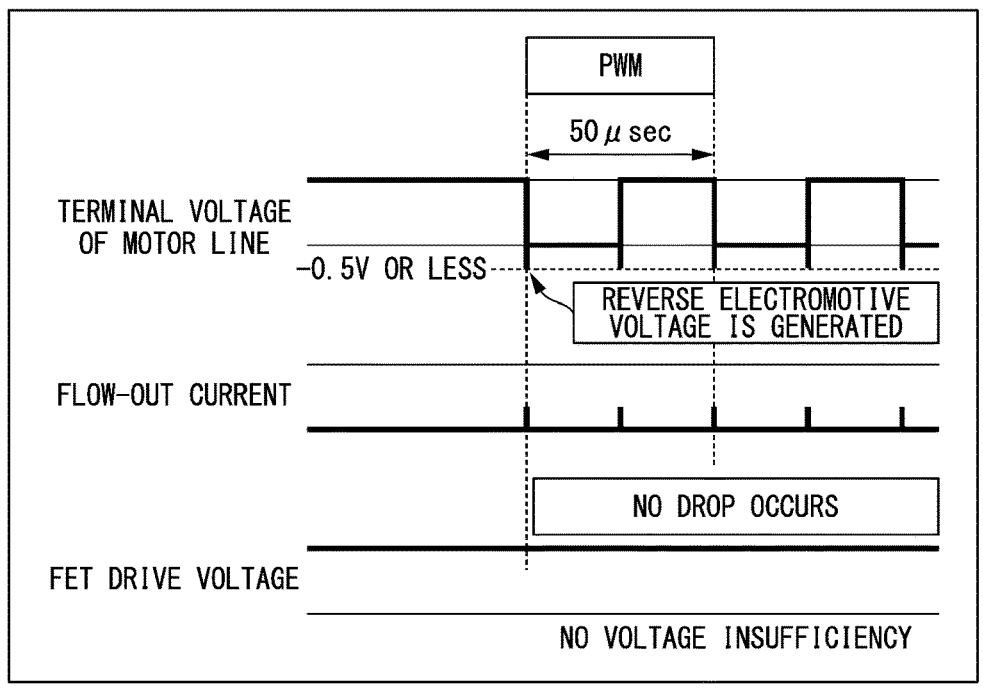
FIG. 3 is a view showing prevention of a period in which a negative voltage is generated at an input terminal of a brushless motor according to the present invention.

FIG. 3 is a view showing prevention of a period in which a negative voltage is generated at an input terminal of a brushless motor according to the present invention.

In FIG. 3, a terminal voltage of a motor line represents the voltage of the terminal 24. A flow-out current represents a current that flows from the FET drive electric source 51 to the terminal 24 via a buffer circuit that constitutes the driver circuit 52. A FET drive voltage represents an output voltage of the FET drive electric source 51.

After the power distribution pattern is switched from the power distribution pattern TP2 to the power distribution pattern TP3, a PWM control having a cycle of 50 μsec is performed, and thereby, it is possible to control the generation period of the reverse electromotive voltage (negative voltage) to about 3 μsec which is a period (dead time of the PWM control signal) in which the pair of switching elements become (OFF, OFF). In the period of 3 μsec, a voltage difference (a negative voltage that is generated when the switching element is switched from ON to OFF when the power distribution pattern is changed from the power distribution pattern TP2a to the power distribution pattern TP3a) of a change from the terminal voltage of the motor line at the time of the power distribution pattern TP2 to the terminal voltage of the motor line at the time of the power distribution pattern TP3 becomes, for example, −0.5V or less, and thereby, a current flows out from the FET drive electric source 51. However, differently from the related art, the FET drive voltage does not become insufficient, and the control circuit 45 that drives the switching element 38a does not malfunction.

Figure 5:
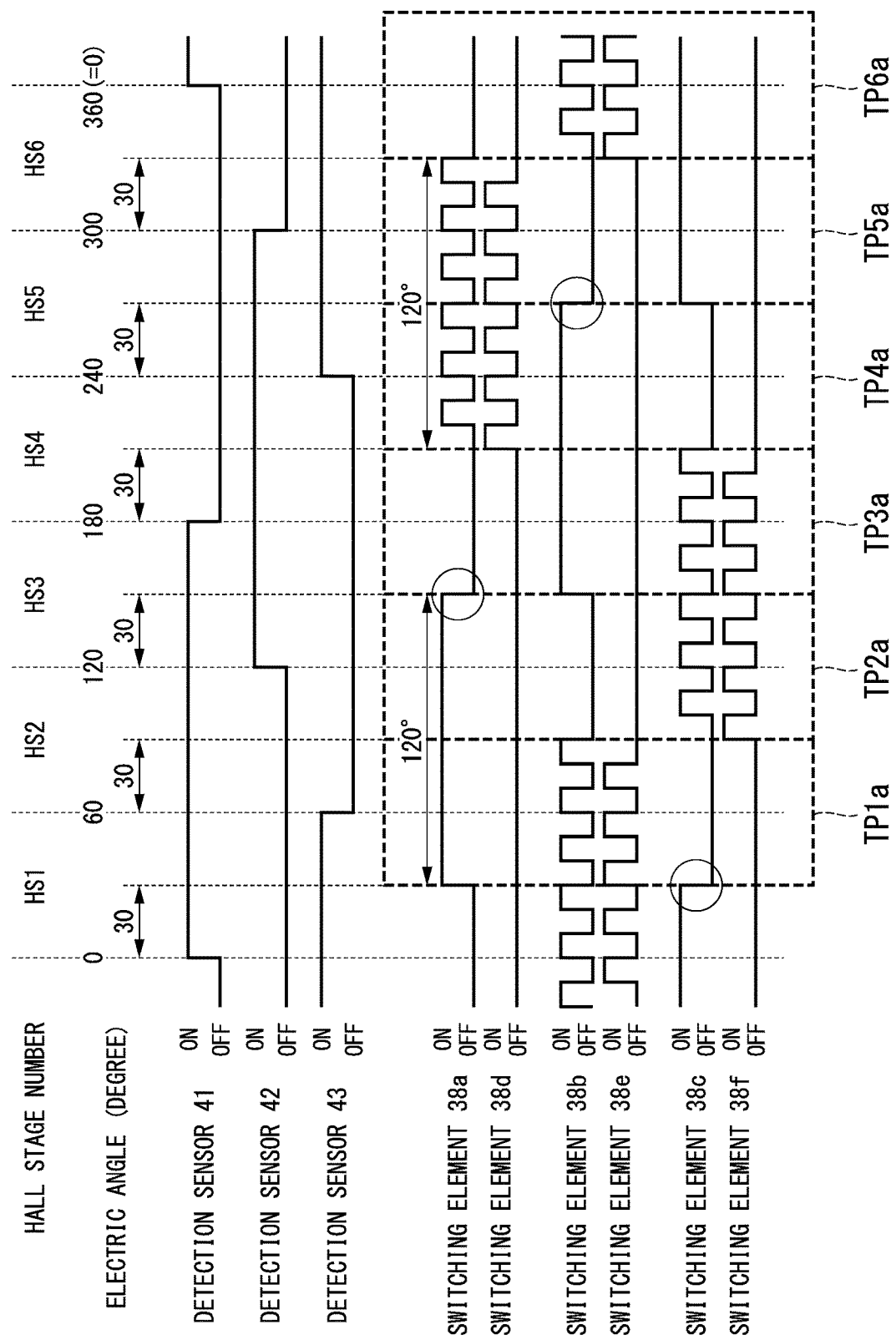
FIG. 5 is a view showing a commutation pattern in a 120° rectangular wave drive.
Figure 6:
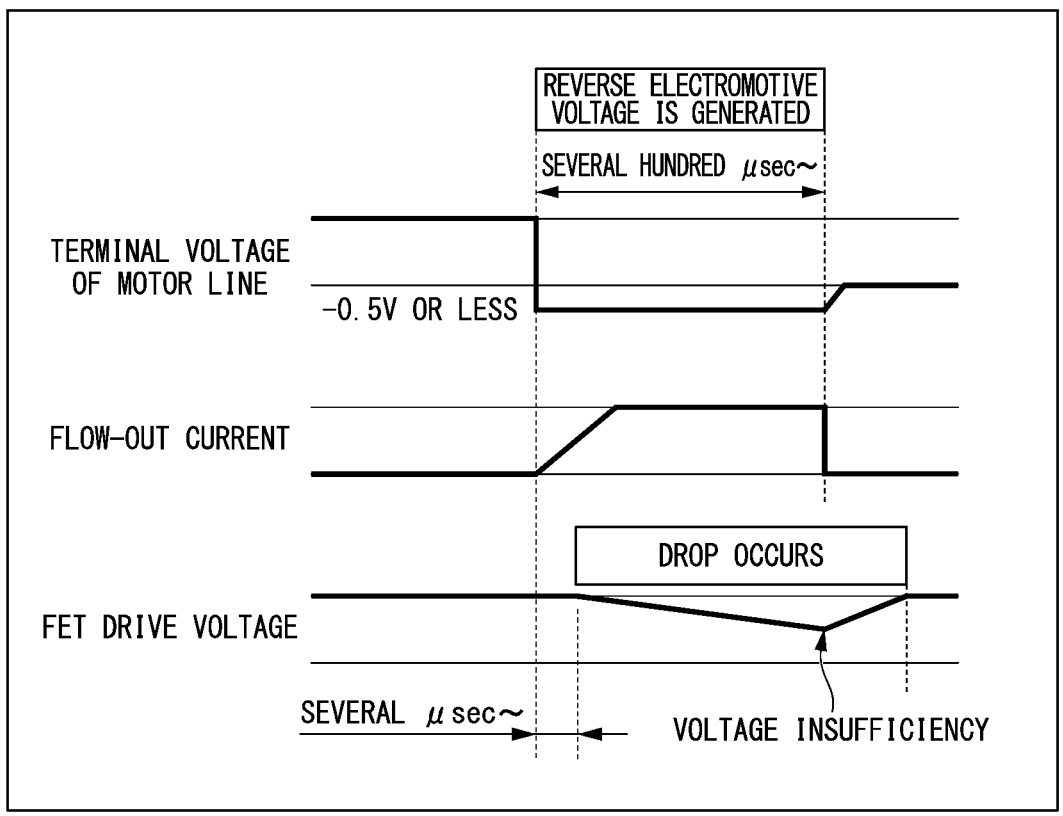
FIG. 6 is a view showing a situation that occurs when a negative voltage is generated at an input terminal of a motor.

That is, according to the aspect of the present invention, by allowing a period (refer to FIG. 5) in which each phase becomes a phase open period of the related art to be a power distribution period (refer to FIG. 2), it is possible to provide a motor drive apparatus that includes a function of reducing a period in which a negative voltage is generated at the input terminal of the brushless motor.

As described above, the motor drive apparatus 37 of the present embodiment is a motor drive apparatus that supplies a current to a plurality of coils which the motor 18 has and that rotates a rotor, the motor drive apparatus including: a plurality of switching elements (switching elements 38a to 380 that turn on or turn off separately current supply routes connected to the plurality of coils; a plurality of detection sensors (detection sensors 41, 42, 43) each of which is provided at a phase different from one another in a rotation direction of the rotor and which are configured to detect a phase in a rotation direction of the rotor and generate an output signal; and an element control part (control part 50) that turns on or turns off the plurality of switching elements separately based on the output signal. Based on the output signal, the element control part outputs a PWM signal having a maximum duty ratio to, among the plurality of switching elements, a pair of switching elements that drive a first coil among the plurality of coils to a high level, outputs a PWM signal having a minimum duty ratio to a pair of switching elements that are connected to each other in series and that drive a second coil among the plurality of coils to a low level, and outputs a PWM signal having a medium duty ratio between the maximum duty ratio of the PWM signal and the minimum duty ratio of the PWM signal to a pair of switching elements that are connected to each other in series and that drive a third coil among the plurality of coils.

According to the aspect of the present invention, it is possible to shorten the reverse electromotive voltage (negative voltage) generation time, it is possible to allow the flow-out current to be small, and it is possible to prevent malfunction of the control circuit 45 (microcomputer). For example, even a microcomputer of the related art that does not include a dedicated IC (IPD) having a negative voltage tolerability is capable of driving a brushless motor.

Further, by outputting the PWM even at a timing (phase open period) which becomes free in the 120° rectangular wave power distribution of the related art, the 180° power distribution is realized as a result, and the current waveform at the time of commutation becomes smooth. Therefore, it is possible to anticipate an advantage that a drive sound becomes quiet.

The motor drive apparatus 37 in the embodiment described above may be realized by a computer. In this case, a program for realizing the function may be recorded in a computer-readable recording medium, and the program recorded in the recording medium may be read into and executed on a computer system to thereby realize the function. The "computer system" used herein includes an OS or hardware such as peripherals. The "computer-readable recording medium" refers to portable media such as a flexible disk, a magneto-optical disc, a ROM, and a CD-ROM and a storage device such as a hard disk embedded in the computer system. Further, the "computer-readable recording medium" may include a recording medium that holds a program dynamically for a short period of time like a network such as the Internet or a communication line when a program is transmitted through a communication line such as a telephone line and may include a recording medium that holds a program for a predetermined period of time like a volatile memory in a computer system which serves as a server or a client in this case. Further, the above program may be a program for realizing some of the functions described above, may be a program capable of realizing the above functions by combination with a program already recorded in the computer system, or may be a program that is realized by using a programmable logic device such as the FPGA (Field Programmable Gate Array).

Although an embodiment of an aspect of the invention has been described in detail with reference to the drawings, a specific configuration is not limited to the embodiment, and designs and the like without departing from the scope of the invention are also included.

For example, in the embodiment, an example is described in which the medium duty ratio is 50%.

However, the medium duty ratio may be 50% of a command duty ratio that is externally input, the maximum duty ratio may be the command duty ratio, and the minimum duty ratio may be 0%. It is possible to anticipate a similar advantage by using any of the duty ratios.

DESCRIPTION OF THE REFERENCE SYMBOLS 18 motor
24, 25, 26 terminal
37, 37a motor drive apparatus
38 inverter circuit
38U, 38V, 38W series circuit
38a, 38b, 38c, 38d, 38e, 38f switching element
40 external electric source
41, 42, 43 detection sensor
45, 45a control circuit
50, 50a control part
51 FET drive electric source
52 driver circuit

The invention claimed is:
1. A motor drive apparatus that supplies a current to a plurality of coils and that rotates a rotor, the motor drive apparatus comprising:
a plurality of switching elements that turn on or turn off respective current supply routes connected to the plurality of coils;
a plurality of detection sensors each of which is provided at a phase different from one another in a rotation direction of the rotor and which are configured to detect a phase in a rotation direction of the rotor and generate an output signal; and an element control part that turns on or turns off the plurality of switching elements individually based on the output signal, wherein, based on the output signal, among the plurality of switching elements, the element control part:

outputs a PWM signal having a maximum duty ratio to a pair of switching elements that drive a first coil among the plurality of coils to a high level, outputs a PWM signal having a minimum duty ratio to a pair of switching elements that are connected to each other in series and that drive a second coil among the plurality of coils to a low level, and outputs a PWM signal having a medium duty ratio between the maximum duty ratio of the PWM signal and the minimum duty ratio of the PWM signal to a pair of switching elements that are connected to each other in series and that drive a third coil among the plurality of coils, and wherein the medium duty ratio is 50%, the maximum duty ratio is a duty ratio obtained by adding half of a command duty ratio that is externally input to the medium duty ratio, and the minimum duty ratio is a duty ratio obtained by subtracting half of the command duty ratio from the medium duty ratio.

2. A motor drive apparatus that supplies a current to a plurality of coils and that rotates a rotor, the motor drive apparatus comprising:

a plurality of switching elements that turn on or turn off respective current supply routes connected to the plurality of coils;

a plurality of detection sensors each of which is provided at a phase different from one another in a rotation direction of the rotor and which are configured to detect a phase in a rotation direction of the rotor and generate an output signal; and an element control part that turns on or turns off the plurality of switching elements individually based on the output signal, wherein, based on the output signal, among the plurality of switching elements, the element control part:

outputs a PWM signal having a maximum duty ratio to a pair of switching elements that drive a first coil among the plurality of coils to a high level, outputs a PWM signal having a minimum duty ratio to a pair of switching elements that are connected to each other in series and that drive a second coil among the plurality of coils to a low level, and outputs a PWM signal having a medium duty ratio between the maximum duty ratio of the PWM signal and the minimum duty ratio of the PWM signal to a pair of switching elements that are connected to each other in series and that drive a third coil among the plurality of coils, and wherein the medium duty ratio is half of a command duty ratio that is externally input, the maximum duty ratio is the command duty ratio, and the minimum duty ratio is 0%.

3. A motor drive apparatus control method which is a control method of a motor drive apparatus that supplies a current to a plurality of coils and that rotates a rotor, the motor drive apparatus comprising:

a plurality of switching elements that turn on or turn off respective current supply routes connected to the plurality of coils;

a plurality of detection sensors each of which is provided at a phase different from one another in a rotation direction of the rotor and which are configured to detect a phase in a rotation direction of the rotor and generate an output signal; and an element control part that turns on or turns off the plurality of switching elements individually based on the output signal, wherein, based on the output signal, among the plurality of switching elements, the element control part:

outputs a PWM signal having a maximum duty ratio to a pair of switching elements that drive a first coil among the plurality of coils to a high level, outputs a PWM signal having a minimum duty ratio to a pair of switching elements that are connected to each other in series and that drive a second coil among the plurality of coils to a low level, and outputs a PWM signal having a medium duty ratio between the maximum duty ratio of the PWM signal and the minimum duty ratio of the PWM signal to a pair of switching elements that are connected to each other in series and that drive a third coil among the plurality of coils, and wherein the medium duty ratio is 50%, the maximum duty ratio is a duty ratio obtained by adding half of a command duty ratio that is externally input to the medium duty ratio, and the minimum duty ratio is a duty ratio obtained by subtracting half of the command duty ratio from the medium duty ratio.

* * * * *